(12) United States Patent
Sakamoto et al.

(10) Patent No.: US 6,967,401 B2
(45) Date of Patent: Nov. 22, 2005

(54) SEMICONDUCTOR DEVICE, SEMICONDUCTOR MODULE AND HARD DISK

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/810,141

(22) Filed: Mar. 16, 2001

(65) Prior Publication Data

US 2002/0041023 A1 Apr. 11, 2002

(30) Foreign Application Priority Data

Oct. 5, 2000 (JP) ..................... P. 2000-306669

(51) Int. Cl.⁷ .................. H01L 23/34; H01L 21/44; H01L 21/48; H01L 21/50
(52) U.S. Cl. ................ 257/706; 257/676; 257/709; 257/712; 257/720; 438/122
(58) Field of Search ................ 257/706, 720, 257/676, 700, 709, 712, 688–690, 778–782, 786, 787, 796; 438/122

(56) References Cited

U.S. PATENT DOCUMENTS

| | | | |
|---|---|---|---|
| 5,352,926 A | | 10/1994 | Andrews .................... 257/717 |
| 5,414,299 A | * | 5/1995 | Wang et al. ................ 257/702 |
| 5,543,663 A | * | 8/1996 | Takubo ....................... 257/720 |
| 5,557,150 A | * | 9/1996 | Variot et al. ................ 257/787 |
| 5,642,261 A | | 6/1997 | Bond et al. .................. 361/704 |
| 5,731,631 A | * | 3/1998 | Yama et al. ................. 257/702 |
| 5,786,628 A | * | 7/1998 | Beilstein, Jr. et al. ...... 257/684 |
| 5,814,894 A | * | 9/1998 | Igarashi et al. ............. 257/787 |
| 5,869,894 A | * | 2/1999 | Degani et al. .............. 257/723 |
| 5,933,709 A | * | 8/1999 | Chun ......................... 438/122 |
| 5,969,426 A | * | 10/1999 | Baba et al. .................. 257/778 |
| 6,140,707 A | * | 10/2000 | Plepys et al. ............... 257/778 |
| 6,201,292 B1 | * | 3/2001 | Yagi et al. .................. 257/666 |
| 6,404,049 B1 | * | 6/2002 | Shibamoto et al. ......... 257/712 |

FOREIGN PATENT DOCUMENTS

| | | | |
|---|---|---|---|
| DE | 19532755 C1 | | 2/1997 |
| JP | 9312355 | | 12/1997 |
| JP | 10308478 A | * | 11/1998 |
| JP | 11-110926 | | 4/1999 |
| JP | 11195730 A | * | 7/1999 |
| JP | 11260985 | | 9/1999 |

OTHER PUBLICATIONS

Nikkei Electronics; No. 691, Jun. 16, 1997. pp. 92–120.

* cited by examiner

*Primary Examiner*—Tom Thomas
*Assistant Examiner*—Chris C. Chu
(74) *Attorney, Agent, or Firm*—Fish & Richardson P.C.

(57) ABSTRACT

A heat radiation electrode (15) is exposed from the back surface of an insulating resin (13), and a metal plate (23) is affixed to this heat radiation electrode (15). The back surface of this metal plate (23) and the back surface of a first supporting member (11) are substantially within a same plane, so that it is readily affixed to a second supporting member (24). Accordingly, the heat generated by the semiconductor chip can be efficiently dissipated via the heat radiation electrode (15), the metal plate (23) and the second supporting member (24).

16 Claims, 13 Drawing Sheets

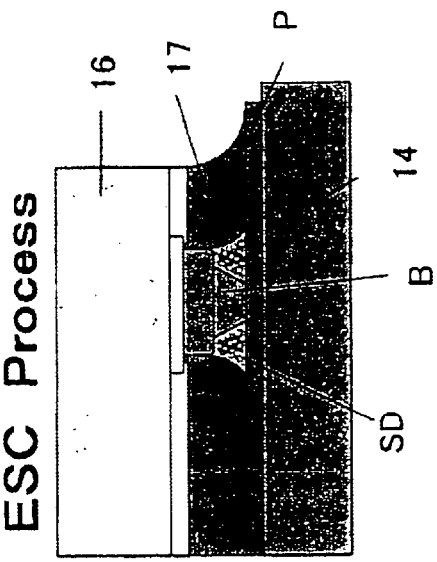
FIG.16A ACP/F Process
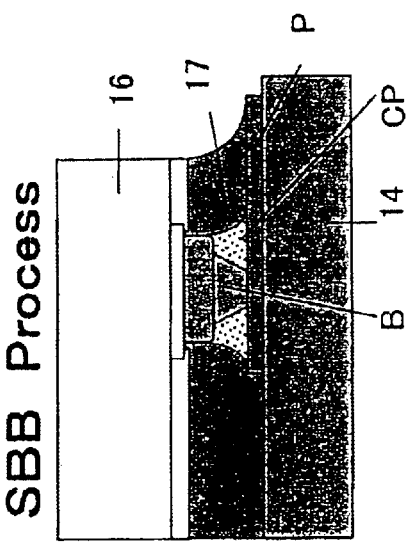
FIG.16B SBB Process
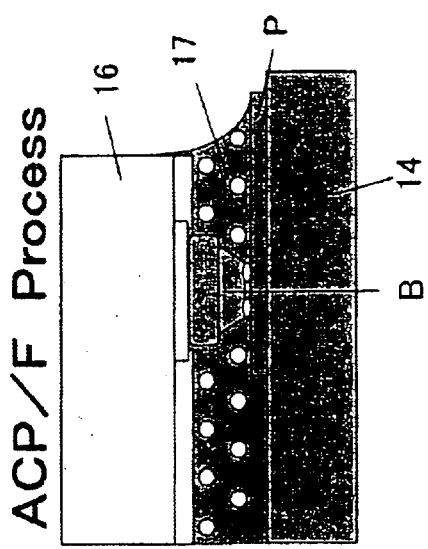
FIG.16C ESC Process
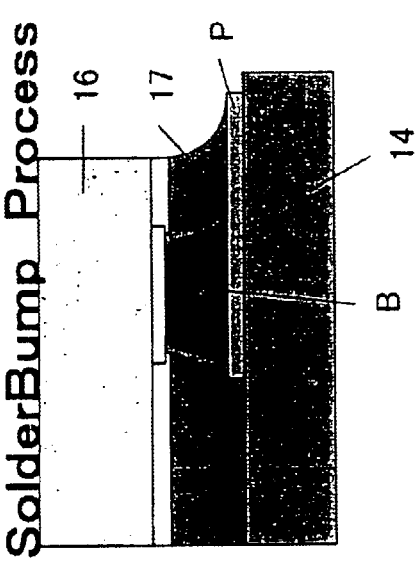
FIG.16D NCP Process
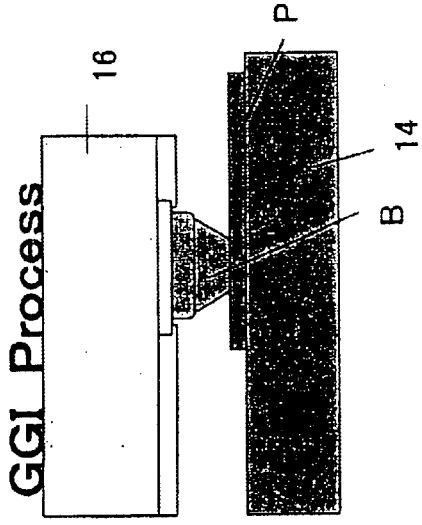
FIG.16E GGI Process
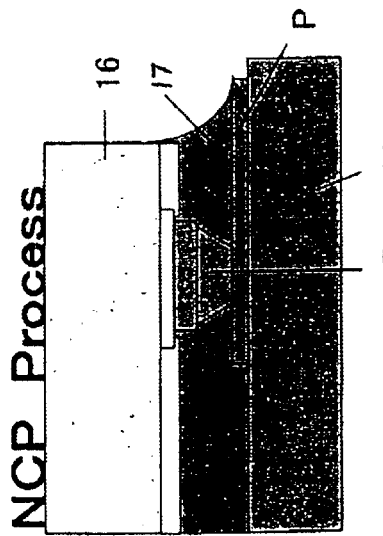
FIG.16F SolderBump Process

SEMICONDUCTOR DEVICE, SEMICONDUCTOR MODULE AND HARD DISK

BACKGROUND OF THE INVENTION

The present invention relates to a semiconductor device, a semiconductor module and a hard disk, and especially to a structure capable of efficiently dissipating heat from a semiconductor chip.

Due to the recent growth of the use of semiconductor devices in portable devices and small/densely-mounted devices, the reduction in size and weight and the improvement in heat dissipation properties are demanded at the same time. In addition, semiconductor devices are mounted on various types of substrates, which, in turn, are mounted in various many systems as semiconductor modules. As for such a substrate, the use of a ceramic substrate, a printed board, a flexible sheet, a metal substrate or a glass substrate etc. may be contemplated, and the following description gives one example thereof. Here, the semiconductor module is explained as being mounted on a flexible sheet.

FIG. 17 shows an example in which a semiconductor module using a flexible sheet is mounted in a hard disk 100. This hard disk 100 may be, for example, the one described in detail in an article of Nikkei Electronics (No. 691, Jun. 16, 1997, p.92-).

This hard disk 100 is accommodated within a casing 101 made of a metal, and comprises a plurality of recording disks 102 that are integrally attached to a spindle motor 103. Over the surfaces of individual recording disks 102, magnetic heads 104 are respectively disposed each with a very small clearance. These magnetic heads 104 are attached at the tips of suspensions 106 which are affixed to the ends of respective arms 105. A magnetic head 104, a suspension 106 and an arm 105 together form one integral body and this integral body is attached to an actuator 107.

The magnetic heads 104 must be electrically connected with a read/write amplifying IC 108 in order to perform read and write operations. Accordingly, a semiconductor module comprising this read/write amplifying IC 108 mounted on a flexible sheet 109 is used, and the wirings provided on this flexible sheet 109 are electrically connected, ultimately, to the magnetic heads 104. This semiconductor module 110 is called "flexible circuit assembly", typically abbreviated as "FCA".

From the back surface of the casing 101, connectors 111 provided on the semiconductor module 110 are exposed, and these connector (male or female) 111 and connectors (female or male) attached on a main board 112 are engaged. On this main board 112, wirings are provided, and driving ICs for the spindle motor 103, a buffer memory and other ICs for a driving, such as ASIC, are mounted.

The recording disk 102 spins at, for example, 4500 rpm via the spindle motor 103, and the actuator 107 detects the position of the magnetic head 104. Since this spinning mechanism is enclosed by a cover provided over the casing 101, there is no way to completely prevent the accumulation of heat, resulting in the temperature rise in the read/write amplifying IC 108. Therefore, the read/write amplifying IC 108 is attached to the actuator 107 or the casing 101 etc. at a location having a better heat conduction property than elsewhere. Further, since revolutions of the spindle motor 103 tend to high speed such as 5400, 7200 and 10000 rpm, this heat dissipation has more importance.

In order to provide further detail of the FCA explained above, the structure thereof is shown in FIG. 18. FIG. 18A is the plan view, and FIG. 18B is a cross-sectional view taken along the line A—A which cuts across the read/write amplifying IC 108 provided on one end of the module. This FCA 110 is attached to an internal portion of the casing 101 in a folded-state, so that it employs a first flexible sheet 109 have a two-dimensional shape that can easily be folded.

On the left end of this FCA 110, the connectors 111 are attached, forming a first connection section 120. First wirings 121 electrically connected to these connectors 111 are adhered on the first flexible sheet 109, and they extend all the way to the right end. The first wirings 121 are then electrically connected to the read/write amplifying IC 108. Leads 122 of the read/write amplifying IC 108 to be connected to the magnetic heads 104 are connected with second wirings 123 which, in turn, are electrically connected to third wirings 126 on a second flexible sheet 124 provided over the arm 105 and suspension 106. That is, the right end of the first flexible sheet 109 forms a second connection section 127 at which the first flexible sheet 109 is connected to the second flexible sheet 124. Alternatively, the first flexible sheet 109 and the second flexible sheet 124 may be integrally formed. In this case, the second wirings 123 and the third wirings 126 are provided integrally.

On the back surface of the first flexible sheet 109 on which the read/write amplifying IC 108 is to be provided, a supporting member 128 is disposed. As for this supporting member 128, a ceramic substrate or an Al substrate may be used. The read/write amplifying IC 108 is thermally coupled with a metal that is exposed to inside of the casing 101 through this supporting member 128, so that the heat generated in the read/write amplifying IC 108 can be externally released.

With reference to FIG. 18B, a connecting structure between the read/write amplifying IC 108 and the first flexible sheet 109 will now be explained.

This flexible sheet 109 is constituted by laminating, from the bottom, a first polyimide sheet 130 (first PI sheet), a first adhesion layer 131, a conductive pattern 132, a second adhesion layer 133 and a second polyimide sheet 134 (second PI sheet), so that the conductive pattern 132 is sandwiched between the first and second PI sheets 130 and 134.

In order to connect the read/write amplifying IC 108, a portion of the second PI sheet 134 and the second adhesion layer 133 are eliminated at a desired location to form an opening 135 which exposes the conductive pattern 132. The read/write amplifying IC 108 is electrically connected thereto through leads 122 as shown in the figure.

The semiconductor device packaged by an insulating resin 136 as shown in FIG. 18B has heat dissipating paths indicated by arrows for externally dissipating its heat. Especially, since the insulating resin 136 gives the thermal resistance, the semiconductor device has a structure that the heat generated by the read/write amplifying IC 108 cannot be efficiently dissipated to the outside the device.

Further details will now be explained using this example in hard disk application. As for the read/write transfer rate of a hard disk, a frequency of 500 MHz to 1 GHz, or even a greater frequency, is required, so that the read/write speed of the read/write amplifying IC 108 must be fast. To this end, the paths of the wirings on the flexible sheet that are connected to the read/write amplifying IC 108 has to be shorten, and the temperature rise in the read/write amplifying IC 108 must be suppressed.

Especially, since the recording disks 102 are spinning at a high speed, and the casing 101 and the lid provide a molded space, the interior temperature would rise up to around 70 to 80° C. On the other hand, a typical allowable temperature for the operation of an IC is approximately 125° C. This means that, from the interior temperature of 80° C., a further temperature rise by approximately 45° C. is permissible for the read/write amplifying IC 108. However, where the thermal resistance of the semiconductor device itself and FCA is large, this allowable operation temperature can easily be exceeded, thereby disabling the device to provide its actual performance level. Accordingly, a semiconductor device and FCA having superior heat dissipating properties are being demanded.

Furthermore, since the operation frequency is expected to further increase in the future, further temperature rise is also expected in the read/write amplifying IC 108 itself due to the heat generated by computing operations. At room temperature, the IC can provide the performance at its intended operation frequency, however, where it is placed inside of a hard disk, its operation frequency has to be reduced in order to restrain the temperature rise.

As described above, further heat dissipating properties of semiconductor device, semiconductor module (FCA) are demanded in connection with the increase of the operation frequency in the future.

On the other hand, the actuator 107, and the arms 105, suspensions 106 and magnetic heads 104 attached thereto has to be designed as light-weighted as possible in order to reduce the moment of inertia. Especially, where the read/write amplifying IC 108 is mounted on the surface of the actuator 107 as shown in FIG. 17, the weight reduction is demanded also for the IC 108 and FCA 110.

SUMMARY OF THE INVENTION

The present invention was invented in consideration with the above problems, and in the first aspect, it provides a semiconductor device comprising a semiconductor chip integrally molded with an insulating resin in a face-down state, the semiconductor device having exposed on the back surface thereof a pad electrically connected to a bonding electrode disposed over the surface of the semiconductor chip, wherein the problem is solved by providing a metal plate on the exposed portion of the heat radiation electrode in a manner so that it protrudes beyond the back surface of the pad.

This protrusive metal plate and the back surface of a flexible sheet used as a first supporting member would become within a same plane, thereby providing a structure which allows the metal plate to be adhered or abutted to an interior surface of a casing, especially to a member of the casing having a flat surface or a heat sink plate etc. Accordingly, heat from the semiconductor chip may be conducted to the heat sink plate.

In the second aspect, the problem is solved by disposing the back surfaces of the pad and the heat radiation electrode substantially within a same plane.

In the third aspect, the problem is solved by affixing the semiconductor chip and the heat radiation electrode together by an insulating material.

In the fourth aspect, the problem is solved by affixing the heat radiation electrode and the metal plate together by an insulating material or a conductive material.

In the fifth aspect, the problem is solved by forming the heat radiation electrode and the metal plate integrally from a same material.

In the sixth aspect, the problem is solved by having the back surface of the insulating resin protrude beyond the back surface of the pad.

In the seventh aspect, the problem is solved by having the side surfaces of the pad and the back surface of the insulating resin which extends from the side surfaces of the pad define a same curved surface.

In the eighth aspect, a semiconductor module is provided, which comprises a first supporting member having a conductive pattern provided thereon and a semiconductor device comprising a semiconductor chip which is electrically connected to the conductive pattern and is integrally molded by an insulating resin in a face-down state, the semiconductor device having exposed on the back surface thereof, a pad electrically connected to a bonding electrode of the semiconductor chip and a heat radiation electrode disposed over the surface of the semiconductor chip, wherein the problem is solved by electrically connecting the pad to the conductive pattern provided on the first supporting member, and providing an opening to the first supporting member at a location which corresponds to the heat radiation electrode, the opening accommodating a metal plate which is affixed to the heat radiation electrode.

In the ninth aspect, the problem is solved by adhering a second supporting member having the metal plate affixed thereto to the back surface of the first supporting member.

In the tenth aspect, the problem is solved by forming the heat radiation electrode and the metal plate integrally from a same material.

In the eleventh aspect, the problem is solved by providing a fixation plate made of a conductive material on the second supporting member at a location corresponding to the metal plate, and thermally coupling the fixation plate and the metal plate.

In the twelfth aspect, the problem is solved by forming, respectively, the metal plate mainly by Cu, the second supporting member mainly by Al, and the fixation plate by a plated film mainly made of Cu formed on the second supporting member.

In the thirteenth aspect, the problem is solved by having the back surface of the insulating resin protrude beyond the back surface of the pad.

In the fourteenth aspect, the problem is solved by having the side surfaces of the pad and the back surface of the insulating resin which extends from the side surfaces of the pad define the same curved surface.

In the fifteenth aspect, the problem is solved by using the semiconductor chip as a read/write amplifying IC for a hard disk.

In the sixteenth aspect, a semiconductor device is provided, which comprises a semiconductor chip integrally molded by an insulating resin in a face-down state, the semiconductor device having exposed on the back surface thereof, a pad electrically connected to a bonding electrode of the semiconductor chip, an external electrode extending via a wiring integral with the pad, and a heat radiation electrode disposed on the surface of the semiconductor chip, wherein a metal plate is provided on the exposed portion of the heat radiation electrode in a manner so that it protrudes beyond the back surface of the external connection electrode.

In the seventeenth aspect, the problem is solved by disposing the back surface of the external connection electrode and the back surface of the heat radiation electrode substantially within a same plane.

In the eighteenth aspect, the problem is solved by affixing the semiconductor chip and the heat radiation electrode together by an insulating material.

In the nineteenth aspect, the problem is solved by affixing the heat radiation electrode and the metal plate together by an insulating material or a conductive material.

In the twentieth aspect, the problem is solved by forming the heat radiation electrode and the metal plate integrally from a same material.

In the twenty-first aspect, the problem is solved by having the back surface of the insulating resin protrude beyond the back surface of the external connection electrode.

In the twenty-second aspect, the problem is solved by having the side surfaces of the external connection electrode and the back surface of the insulating material which extends from the side surfaces of the external connection electrode define a same curved surface.

In the twenty-third aspect, a semiconductor module is provided, which comprises a first supporting member having a conductive pattern provided thereon, and a semiconductor device comprising a semiconductor chip which is electrically connected to the conductive pattern and is integrally molded by an insulating resin in a face-down state, the semiconductor device having exposed on the back surface thereof, a pad electrically connected to a bonding electrode of the semiconductor chip, an external connection electrode provided via a wiring integral with the pad and a heat radiation electrode disposed on the surface of the semiconductor chip, wherein the problem is solved by electrically connecting the conductive pattern provided on the first supporting member and the external connection electrode, and providing an opening in the first supporting member at a location corresponding to the heat radiation electrode, the opening accommodating a metal plate affixed to the heat radiation electrode.

In the twenty-fourth aspect, the problem is solved by adhering a second supporting member having the metal plate affixed thereto onto the back surface of the first supporting member.

In the twenty-fifth aspect, the problem is solved by forming the heat radiation electrode and the metal plate integrally from a same material.

In the twenty-sixth aspect, the problem is solved by providing a fixation plate made of a conductive material on the second supporting member at a location corresponding to the metal plate, and by thermally coupling the fixation plate and the metal plate.

In the twenty-seventh aspect, the problem is solved by forming, respectively, the metal plate mainly by Cu, the second supporting member mainly by Al and the fixation plate by a plated film mainly made of Cu formed on the second supporting member.

In the twenty-eighth aspect, the problem is solved by having the back surface of the insulating adhesive means protrude beyond the back surface of the external connection electrode.

In the twenty-ninth aspect, the problem is solved by having the side surfaces of the external connection electrode and the insulating adhesive means adhered to the side surfaces of the external connection electrode define a same curved surface.

In the thirtieth aspect, the problem is solved by using the semiconductor chip as a read/write amplifying IC for a hard disk.

BRIEF DESCRIPTION OF THE DRAWINGS

FIGS. 15A–15D are diagrams illustrating a semiconductor device according to the present invention.

FIGS. 16A–16F shows a series of diagrams illustrating several methods for forming a connection structure of the semiconductor chip and the pads.

DETAILED DESCRIPTION OF THE PREFERRED EMBODIMENTS

The present invention provides a thin and small semiconductor device having a superior heat-dissipating capability, and a semiconductor module having this semiconductor device mounted thereon, such as a semiconductor module attached on a flexible sheet (hereinafter referred to as "FCA"), thereby providing improvement in the characteristics of, for example, a hard disk.

Figure 1A:
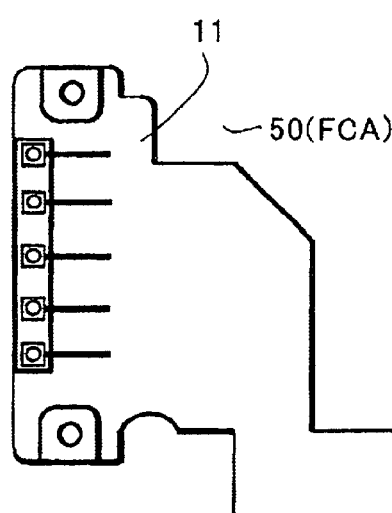
FIGS. 1A–1C are diagrams illustrating a semiconductor module according to the present invention.
Figure 17:
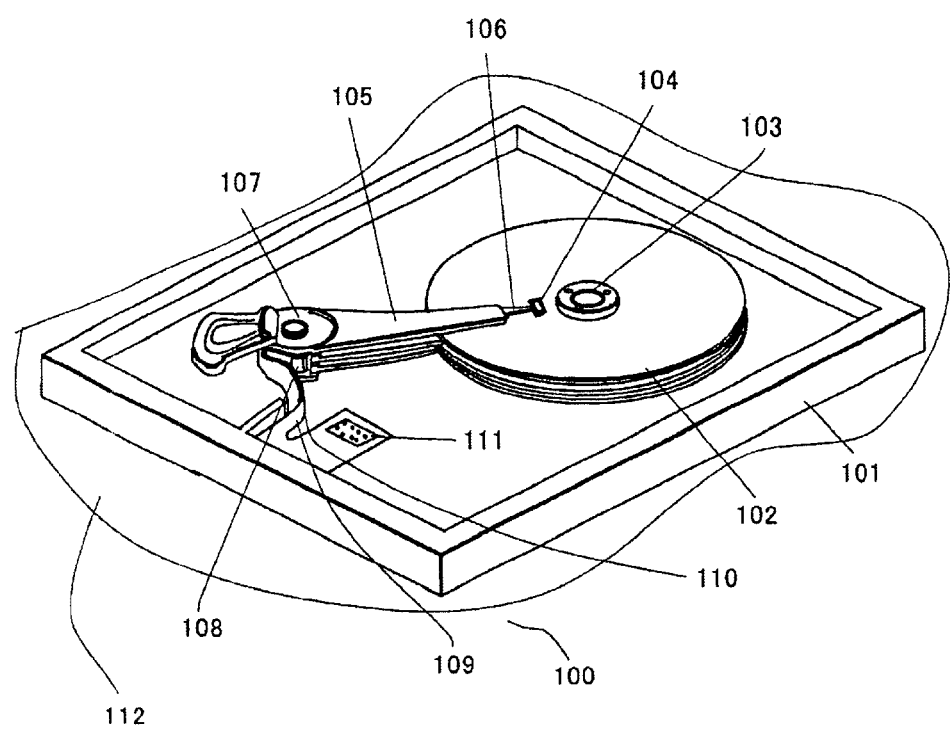
FIG. 17 is a diagram illustrating a hard disk.

First, reference shall be made to FIG. 17 illustrating an exemplary hard disk 100 in which such an FCA is implemented, and then to FIG. 1 showing the FCA. A semiconductor device mounted on this FCA and the manufacturing method thereof are shown in FIGS. 2 through 16.

(Embodiment 1)

The first embodiment is provided to illustrate an apparatus in which the FCA is implemented. As for this apparatus, the exemplary hard disk 100 shown in FIG. 17 that has been used for illustrating the conventional art will again be used.

The hard disk 100 may be mounted on a main board 112 as necessary in order to place it in a computer etc. This main board 112 includes female (or male) connectors. Male (or female) connectors 111 provided on the FCA and exposed from the back surface of the casing 101 are connected with these connectors on the main board 112. Within the casing 101, a plurality of recording disks 102 used as a recording medium are provided in a number corresponding to the storage capacity of the hard disk. Since each of the magnetic heads 104 floats and scans over each of the recording disks 102 at a position approximately 20 nm to 30 nm away from the disk, the interval between the recording disks 102 are designed so as to allow this scanning to be undisturbed. The disks are attached to a spindle motor 103 at this interval. This spindle motor 103 is mounted on a mounting board, and a connector arranged on the back surface of this mounting board is exposed from the back surface of the casing 101. This connector is connected to a connector of the main board. Accordingly, mounted on this main board 112 are, an IC for driving the read/write amplifying IC 108 for the magnetic heads 104, an IC for driving the spindle motor 103, an IC for driving an actuator, a buffer memory for temporarily storing data, and other ICs for implementing the manufacturer's own driving scheme such as ASIC. Of cause, any additional active and passive elements may also be mounted.

Figure 1C:
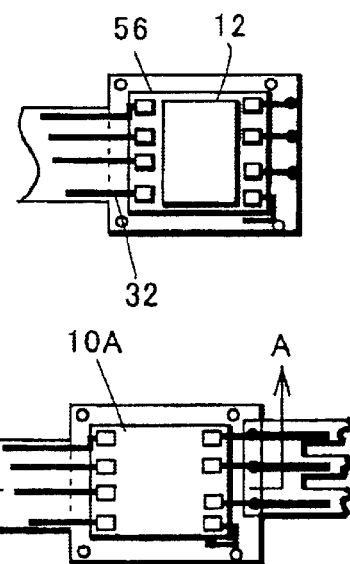
Figure 1B:
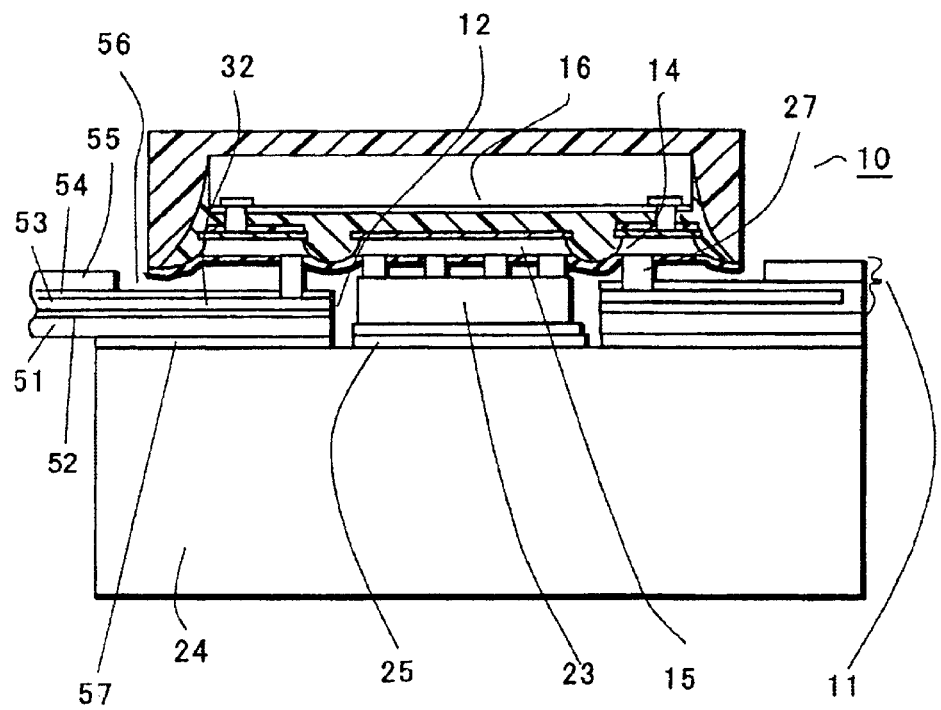
Figure 18A:
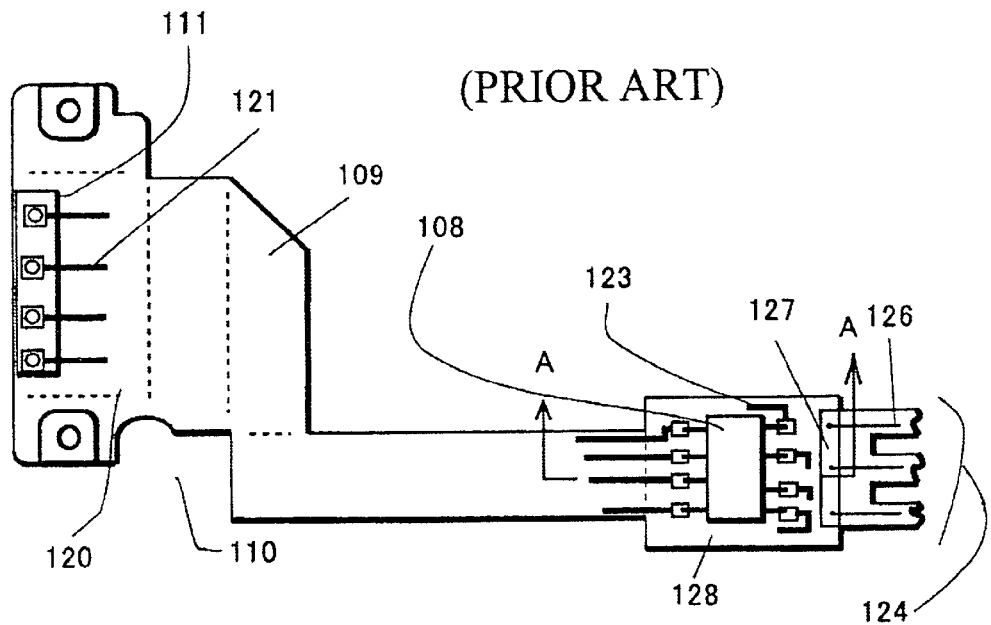
FIGS. 18A–18B are diagrams illustrating a conventional art semiconductor module used in the hard disk of FIG. 17.
Figure 18B:
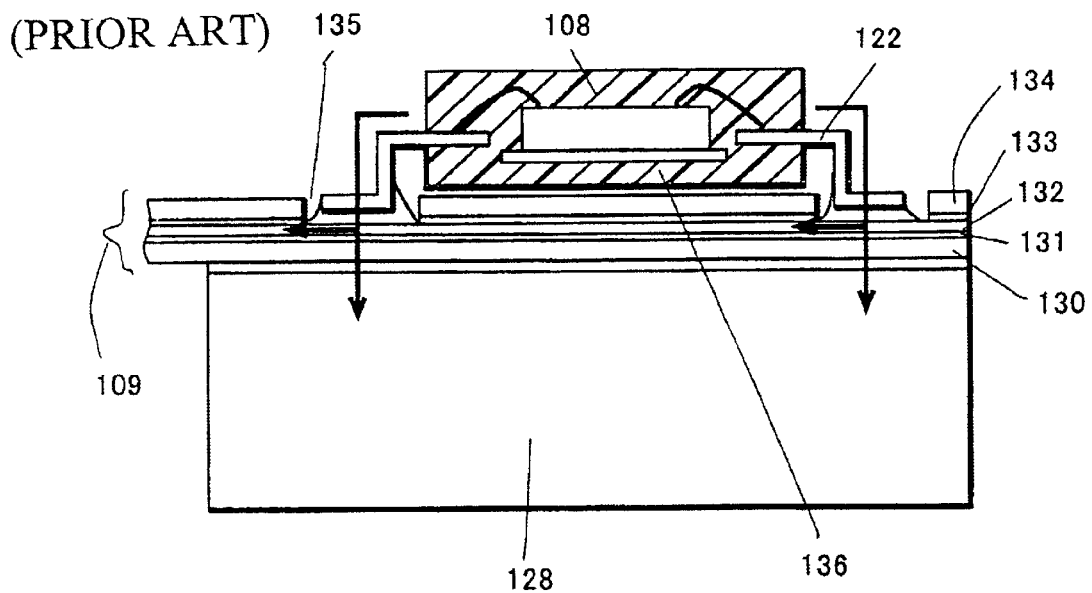

The wirings connecting between the magnetic heads 104 and the read/write amplifying IC 108 are designed to be as short as possible, so that the read/write amplifying IC 108 is disposed over the actuator 107. However, since the semiconductor device hereinafter explained is extremely thin and light-weighted, it may be mounted over the arm 105 or the suspension 106 instead of the actuator 107. In this case, as shown in FIG. 1B, the back surface of the semiconductor device 10 exposes from the opening 12 of the first supporting member 11, and the back surface of the semiconductor device 10 is thermally coupled with the arm 105 or the suspension 106, so that the heat from the semiconductor device 10 is externally dissipated via the arm 105 and the casing 101.

Where the read/write amplifying IC 108 is mounted on the actuator 107 as shown in FIG. 17, the circuits for reading and writing respective channels are formed on a single chip so as to enable the plurality of magnetic sensors to read and write. However, a dedicated read/write circuit may be mounted on each of the suspensions 106 for each of the magnetic heads 104 that are attached to the respective suspension 106. In this way, the wiring distance between a magnetic head 104 and a read/write amplifying IC 108 may be far shorter than that in the structure shown in FIG. 18, and such a short distance would reduce the impedance, resulting in an improved read/write rate.

(Embodiment 2)

Figure 2A:
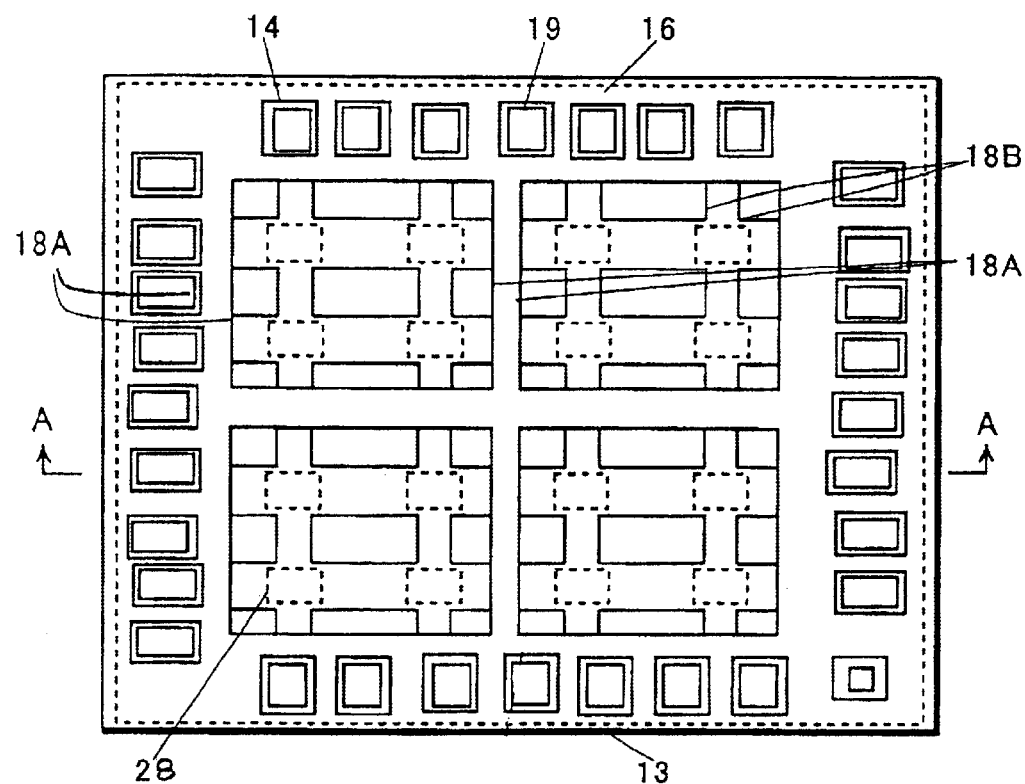
FIGS. 2A–2B are diagrams illustrating a semiconductor device according to the present invention.
Figure 2B:
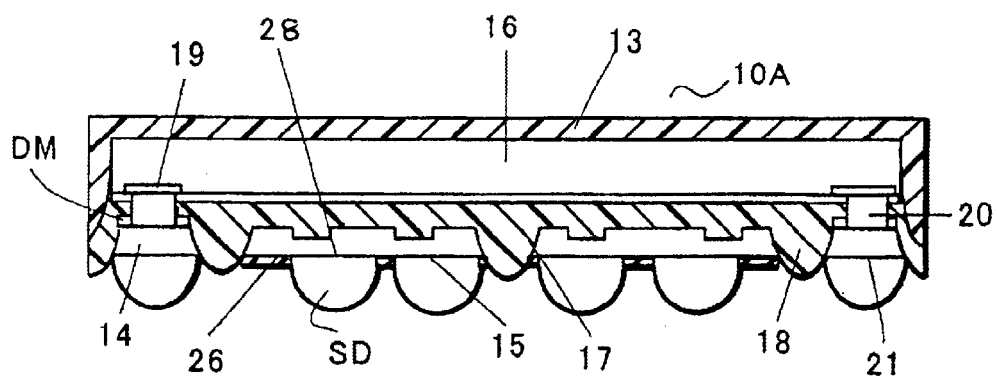

The semiconductor device according to the second embodiment of the present invention will now be explained with reference to FIG. 2. FIG. 2A is a plan view of the semiconductor device, and FIG. 2B is a cross-sectional view taken along the ling A—A.

In FIG. 2, the following elements are shown as embedded within an insulating resin 13; pads 14, a heat radiation electrode 15 provided within a region surrounded by these bonding pads 14, and a semiconductor chip 16 disposed over the heat radiation electrode 15. The semiconductor chip 16 is mounted in a face-down state, and is affixed to the heat radiation electrode 15 which is divided into four pieces in order to achieve good adhesion by using an insulating adhesive means 17. The isolation trenches formed by this division are indicated by the numeral 18A. Where the gap between the semiconductor chip 16 and the heat radiation electrode 15 is so small that the intrusion of the insulating adhesive means 17 is disturbed, then trenches 18B that are shallower than the aforementioned isolation trenches 18A may be formed on the surface of the heat radiation electrode 15.

The bonding electrodes 19 of the semiconductor chip 16 and the pads 14 are electrically connected via a brazing material such as solder. Alternatively, stud bumps of Au may also be used in the place of solder.

There are other types of connecting methods for achieving these connections. For example, after bumps are provided on the respective bonding electrodes 19 of the semiconductor chip, the connections may be obtained through the application of ultrasonic wave to these bumps or through pressure welding. Also, at the peripheries of the pressure-welded bumps, solder, a conductive paste or anisotropic conductive particles may be provided. The greater details of these structures will be provided at the end of this embodiment section.

The back surfaces of the pads 14 are exposed from the insulating resin 13, and as they are, form external connection electrodes 21, and the side surfaces of the pads 14 are etched non-anisotropically. These etched portions are formed by a wet etching method, so that they have a curved structure which promotes an anchor effect.

The present structure is constituted by five elements including the semiconductor chip 16, a plurality of conductive patterns 14, the heat radiation electrode 15, the insulating adhesive means 17, and the insulating resin 13 within which all the former elements are embedded. Within a region for disposing the semiconductor chip 16, the insulating adhesive means 17 is formed over and between the pieces of the heat radiation electrode 15, especially within the isolation trenches 18 formed by etching, so that the back surface of the insulating adhesive means 17 is exposed from the back surface of the semiconductor device 10A. All the elements including the above are molded within the insulating resin 13. The pads 14, heat radiation electrode 15 and semiconductor chip 16 are supported by the insulating resin 13 and the insulating adhesive means 17.

As for the insulating adhesive means 17, an adhesive made of an insulating material or an under fill material is preferable. Where an adhesive is employed, it may be applied to the surface of the semiconductor chip 16 in advance, and cured as the pads 14 are connected using Au bumps instead of solder 20. In the case of the insulating adhesive means 17 as an under fill material, it may be injected into the gap after the solder 20 (or bumps) and pads 14 are connected.

As for the insulating resin, a heat-curable resin such as epoxy resin, or a thermoplastic resin such as polyimide resin or polyphenylene sulfide etc. may be used.

As for the insulating resin 13, any resin material can be used as long as it can be cured using a metal mold, or can be applied by dipping or coating. For the material of the conductive patterns such as the pads 14 and the heat radiation electrodes 15, a conductive foil mainly made of Cu, a conductive foil mainly made of Al or an Fe-Ni alloy, a laminate of Al-Cu or Al-Cu-Al or the like may be used. Of course any other conductive material may also be used, and especially desirable are those conductive materials that can be etched, or that can be evaporated by laser. Where the half-etching, plating and thermal stress characteristics are concerned, a conductive material mainly made of Cu formed through rolling is suitable.

According to the present invention, the trenches 18 are also filled with the insulating resin 13 and the insulating adhesive means 17 so that slipping-out of the conductive pattern may be prevented. Also, by performing non-anisotropic etching through a dry-etch or wet-etch method, the side surfaces of the bonding pads 14 may be processed to have a curved structure thereby promoting the anchor effect. This realizes a structure that would not allow the pads 14 and the heat radiation electrodes 15 to slip out from the insulating resin 13.

Moreover, the back surface of the heat radiation electrode 15 is exposed from the back surface of the package. Therefore, the back surface of the heat radiation electrode 15 would form a structure that can be abutted or attached to the later-described metal plate 23, the second supporting member 24 or a fixation plate 25 formed on the second supporting member 24. Accordingly, this structure allows the heat generated by the semiconductor chip 16 to be dissipated into the second supporting member 24, thereby preventing the temperature rise in the semiconductor chip 16 so that the driving current and driving frequency of the semiconductor chip 16 maybe increased.

In the semiconductor device 10A, since the pads 14 and the heat radiation electrode 15 are supported by the insulating resin 13, which is a molding resin, the use of any supporting substrate is unnecessitated. This structure is one feature of the present invention. The conductive paths of the conventional art semiconductor device are supported by a supporting substrate (flexible sheet, printed board or ceramic substrate), or by a lead frame, and this means that the conventional art device includes those elements that could potentially be unnecessitated. On the other hand, the device of the present invention is constituted by only essential, minimal elements, and it eliminates the need for a supporting substrate, thus it can be made thin and light-weighted, and at the same time, its cost may be reduced as it require less material cost. Accordingly, as explained in the description of the first embodiment, it may be mounted on the arms or suspensions of a hard disk.

From the back surface of the package, the pads 14 and the heat radiation electrode 15 are exposed. Where a brazing material such as solder is applied over these regions, since the area of the heat radiation electrode 15 is larger, the thickness of the applied brazing material becomes uneven. Accordingly, in order to make the film thickness of the brazing material even, an insulating film 26 is formed on the back surface of the semiconductor device 10A. The regions 28 surrounded by dotted lines shown in FIG. 2A indicate the portions of the heat radiation electrode 15 exposed from the insulating film 26, and these portions are exposed in the same manner as the exposed square-shaped portions of the back surfaces of the bonding pads 14, the individual potions of the heat radiation electrode 15 exposed from the insulating film 26 and the exposed portions of the bonding pads 14 have the same size.

Thus, the sizes of the portions wettable by the brazing material are substantially identical so that the brazing material formed thereto would have substantially the same thickness. This would not change even after a solder print or reflow process. The same is true for a conductive paste of i.e. Ag, Au or Ag-Pd etc. Given this structure, more accurate calculation can be performed to determine how much the back surface of the metal plate 23 should protrude beyond the back surfaces of the pads 14.

When the metal plate 23 and a conductive pattern 32 are designed to align within a same plane, then both the pads 14 and the heat radiation electrode 15 may be soldered at once. The regions 28 of the heat radiation electrode 15 exposed from the insulating film 26 may be formed to have a larger size than that of the exposed portions of the bonding pad in consideration with the capability to dissipate the heat from the semiconductor chip.

The provision of the insulating film 26 also allows the conductive pattern provided on the first supporting member 11 to be disposed over the back surface of the semiconductor device. Generally, wirings provided on the side of the first supporting member 11 are so arranged that they bypass the region over which the semiconductor device is attached in order to prevent short-circuiting, however, the provision of the insulating film 26 allows them to be disposed without such bypassing. In addition, the insulating resin 13 and the insulating adhesive means 17 protrude beyond the conductive patterns, thereby enabling to prevent short-circuiting between solder balls SD provided on the back surface of the semiconductor device 10A.

(Embodiment 3)

Figure 3A:
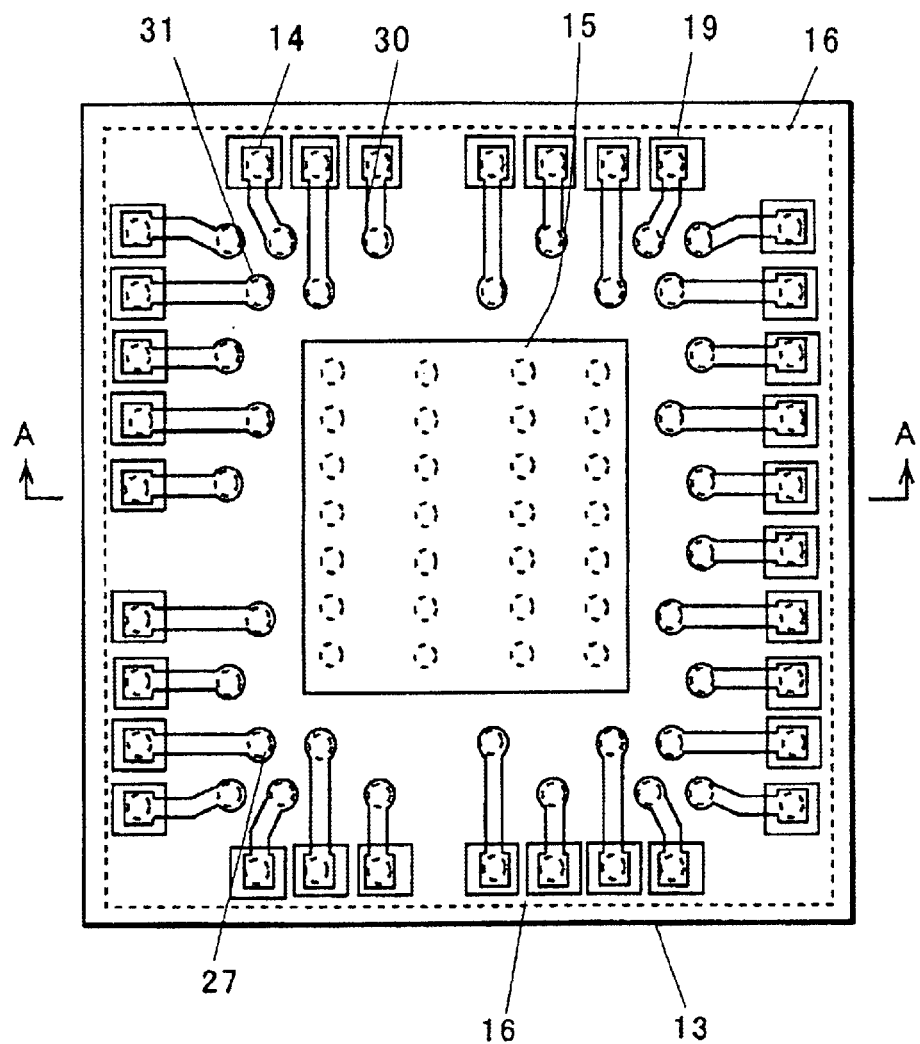
FIGS. 3A–3B are diagrams illustrating a semiconductor device according to the present invention.
Figure 3B:
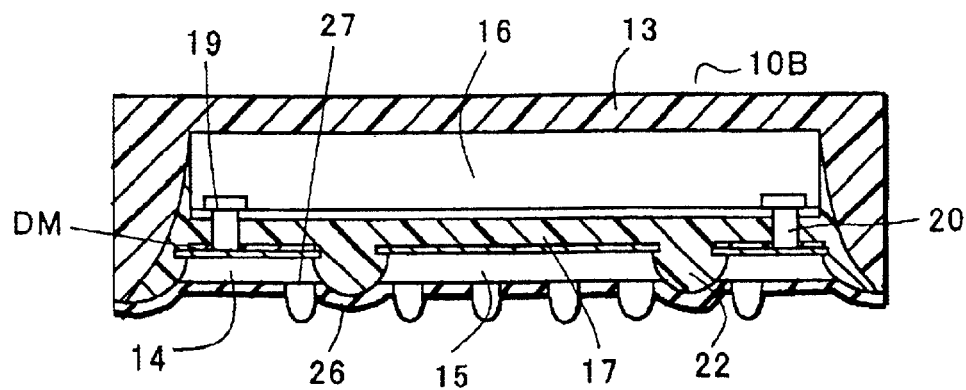

FIG. 3 shows another semiconductor device 10B according to the present invention. FIG. 3A is a plan view thereof, and FIG. 3B is a cross-sectional view taken along the line A—A. Since this structure is similar to that of FIG. 2, the following provides only the description pertinent to those features that are different from the device in FIG. 2.

In FIG. 2, the back surfaces of the pads 14 are used as the external connection electrodes as they are, however, in this embodiment, an integral wiring 30 and an external connection electrode 31 integrally formed with the wiring 30 are provided to each of the pads 14.

In FIG. 2A, The rectangle shown by a dotted line represents the semiconductor chip 16, and on the back surface of the semiconductor chip 16, the external connection electrodes 31 are disposed in a ring-like arrangement as shown. This arrangement is identical or similar to that of a known BGA.

When the semiconductor chip 16 is disposed directly over the conductive patterns 14, 30 and 31 and the heat radiation electrode 15, the patterns and the heat radiation electrodes are short-circuited via the back surface of the semiconductor chip 16. Accordingly, the adhesive means 17 has to be an insulating material, and any conductive material must not be used.

The conductive pattern 32 on the first supporting member 11 is connected to the external connection electrodes 31, and the back surfaces of the pads 14 and the wirings 30 are covered by the insulating film 26. The dotted circles indicated in the regions of the external connection electrodes 31 and the heat radiation electrode 15 represent the portions that expose from the insulating film 26.

Furthermore, since the external connection electrodes 31 are provided over the back surface of the semiconductor chip 16, the heat radiation electrode 15 is designed to be smaller than the heat radiation electrode 15 of FIG. 2. Accordingly, the insulating adhesive means 17 covers the heat radiation electrode 15, external connection electrodes 31, the wirings 30, and the pads 14. The insulating resin 13 covers the insulating adhesive means 17 covering the heat radiation electrode 15, external connection electrodes 31, the wirings 30 and the pads 14, and the semiconductor chip 16.

The present embodiment has an advantage in that, even when the number of the bonding pads 14 is extremely large and their size has to be reduced, the size of the external connection electrodes 31 may be made sufficiently large by connecting them via the wirings and rearranging them as the external connection electrodes. Also, the provision of the wirings alleviates the distortion stress applied to the bonding sections. Especially, wavy wirings are effective. Since the semiconductor chip 16 and the heat radiation electrode 15 are affixed together by an insulating adhesive means 17, which is an insulating material, there is a concern of thermal resistance. However, by constituting the insulating adhesive means by a silicon resin mixed with fillers such as those made of silicon oxide or aluminum oxide that contribute to thermal conduction, the heat from the semiconductor chip 16 may efficiently be conducted into the heat radiation electrode 15.

The distance between the heat radiation electrode 15 and the back surface of the semiconductor chip 16 may be made even by designing the fillers to have a same diameter. Therefore, where a very small separation is desired in consideration with the thermal conduction, such a small separation may easily be formed by lightly applying a pressure to the semiconductor chip 16 while the insulating adhesive means is in a soft state.

(Embodiment 4)

The fourth embodiment explains a manufacturing method of the semiconductor devices 10A and 10B. Between the manufacturing methods of the semiconductor devices 10A and 10B, the only difference is whether it fabricates the pattern including only the heat radiation electrode 15 and the pads 14, or the pattern additionally including the wirings 30 and the external connection electrodes 31. Since either of the methods employs half-etching to form convex patterns, only the geometries of the patterns are different, and the steps are substantially identical.

The explanation will be provided herein with reference to the manufacturing method of the semiconductor device 10B shown in FIG. 3. FIGS. 4 through 9 provide the cross-sectional views of FIG. 3A taken along the line A—A.

Figure 4:
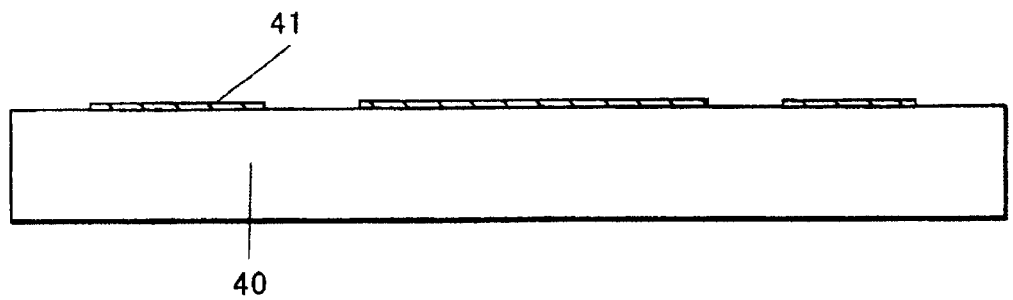
FIG. 4 is a diagram illustrating a manufacturing step of a semiconductor device according to the present invention.

First, as shown in FIG. 4, a conductive foil is provided. The thickness of the foil is desirably between 10 $\mu$m and 300 $\mu$m, and herein, a rolled copper foil in a thickness of 70 $\mu$m is used. Next, over the surface of this conductive foil 40, a conductive film 41 or a photo resist is formed as an etching mask. This pattern is identical to the patterns of the pads 14, wirings 30, external connection electrodes 31 and heat radiation electrode 15 of FIG. 3A. Where a photo resist is used instead of the conductive film 41, at a layer below the photo resist, a conductive film made of Au, Ag, Pd or Ni etc. is formed at least in the regions corresponding to the pads. This film is provided to allow bonding. (FIG. 4)

Thereafter, the conductive foil 40 is half-etched via the conductive film 41 or the photo resist. The depth of etching may be arbitrary as long as it is shallower than the thickness of the conductive foil 40. A shallower etching depth allows the formation of a finer pattern.

By this half-etching, the convex patterns for 14, 30 and 31, and for the heat radiation electrode 15 manifest over the conductive foil 40. The conductive foil 40 used herein is, as previously mentioned, a Cu foil mainly made of Cu, which has been formed by rolling. However, it may also be a conductive foil made of Al or an Fe-Ni alloy, or a laminate of Cu-Al or Al-Cu-Al. The laminate of Al-Cu-Al or Cu-Al-Cu, especially, can prevent warping caused by a difference in thermal expansion coefficients.

Figure 5:
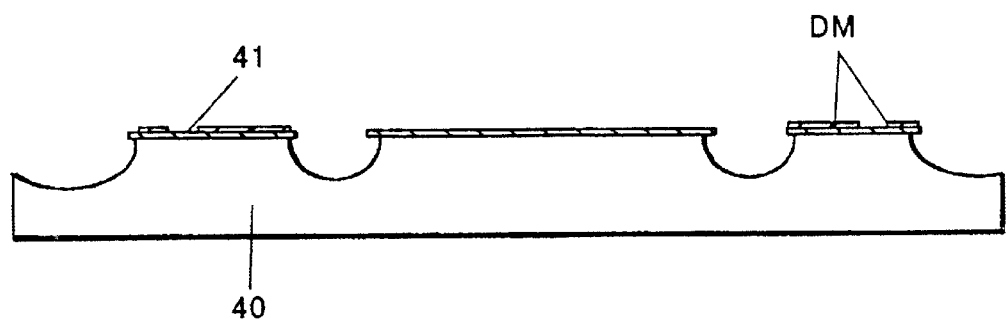
FIG. 5 is a diagram illustrating a manufacturing step of a semiconductor device according to the present invention.

The insulating adhesive means 17 is then applied onto the region corresponding to the rectangle indicated by a dotted line in FIG. 3. This insulating adhesive means 17 is provided in and over the isolation trench 22 between the heat radiation electrode 15 and the external connection electrodes 31, an isolation trench between the heat radiation electrode 15 and the wirings 30, and isolation trenches between wirings 30. The element indicated by "DM" is a film for preventing the running of solder SD1 applied thereto. Without the provision of this solder-running prevention film, there would be a risk of promoting a tilt in the affixed position of the semiconductor chip 16, resulting in the difficulty in injecting the insulating adhesive means 17 or cleaning fluid. (FIG. 5)

The semiconductor chip 16 is then affixed to the region on which the insulating adhesive means 17 has been provided, and the bonding electrodes 19 of the semiconductor chip 16 and the pads 14 are electrically connected. In the embodiment shown in the diagrams, since the semiconductor chip 16 is mounted with its face down, the solder balls SD1 are used as the connecting means.

In this bonding process, since the pads 14 are integral with the conductive foil 40, and the back surface of the conductive foil 40 is flat, the device can be abutted to the table of the bonding machine by the plane. Accordingly, if the conductive foil 40 is perfectly fixed onto the bonding table, the pads 14 and the solder balls formed on the semiconductor chip 16 are all abutted in place, so that soldering failures would not occur. The fixation to the bonding table may be achieved by, for example, providing a plurality of vacuum holes over the entire surface of the table. There are other alternative methods for providing these connections, which will be explained at the end of this section with reference to FIG. 16.

Figure 6:
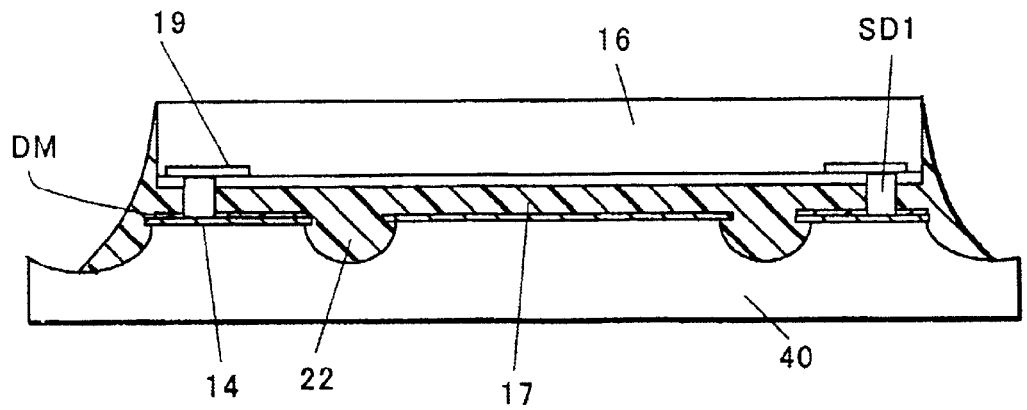
FIG. 6 is a diagram illustrating a manufacturing step of a semiconductor device according to the present invention.

The semiconductor chip may be mounted without using a supporting substrate, and the solder balls are used instead of metal thin lines, so that the semiconductor chip 16 may be disposed at a position lower by that extent. Accordingly, the outer thickness of the package maybe reduced as later explained.

Where an under fill is used as the insulating adhesive means 17, the under fill is introduced after the semiconductor chip 16 and the pads 14 are attached. (FIG. 6)

The insulating resin 13 is then formed over the entire region including the semiconductor chip 16. For the insulating resin, either a thermoplastic resin or a heat-curable resin may be used.

It maybe formed via transfer molding, injection molding, dipping or coating. For a heat-curable resin such as epoxy resin, transfer molding may be employed, and for a thermoplastic resin such as liquid crystal polymer or polyphenylene sulfide etc., injection molding may be employed.

In the present embodiment, the thickness of the insulating resin is adjusted so that its top end comes at approximately 100 $\mu$m from the back surface of the semiconductor chip 16. This thickness may be made larger or smaller depending on the desired strength of the semiconductor device. Alternatively, the back surface of the semiconductor chip may be exposed as shown in FIG. 14B. In this case, radiator fins may be attached thereon, or direct external dissipation of the heat generated by the semiconductor chip may be attempted.

Since the pads 14, wirings 30, the external connection electrodes 31 and the heat radiation electrode 15 are all integral with the conductive foil 40 that is in a form of a sheet, these copper foil patterns would never bed is placed during the resin injection step as long as the conductive foil 40 itself is not displaced. In addition, unlike lead frames, these conductive patterns would never generate flashes of the resin.

Figure 7:
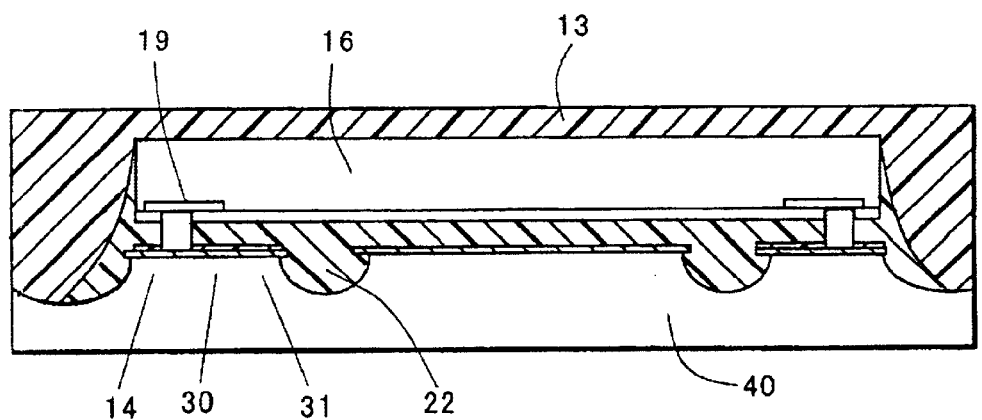
FIG. 7 is a diagram illustrating a manufacturing step of a semiconductor device according to the present invention.

As explained in the above, within the insulating resin 13, the pads 14, wirings 30, external connection electrodes 31 and the heat radiation electrode 15 that are formed as convex features are embedded along with the semiconductor chip 16, and the portion of the conductive foil 40 below its convex features is exposed from the back surface. (FIG. 7)

Thereafter, the portion of the conductive foil 40 exposed on the back surface of the insulating resin 13 is eliminated, thereby separating the pads 14, wirings 30, external electrodes 31 and heat radiation electrode 15 into individual elements.

For this separation step, various approaches may be contemplated. For example, they may be separated by etching the back surface, or by polishing or grinding, or even by the combination thereof. For example, where the grinding is performed until the insulating resin 13 is exposed, there is a risk of having residues or stretched metal particles from the ground conductive foil 40 encroach into the insulating resin 13 or the insulating adhesive means 17. Accordingly, by using an etching approach, the separation may be achieved without having the metal residues from the conductive foil 40 encroach into the surface of the insulating resin 13 or the insulating adhesive means 17 located between the Cu patterns. In this way, short-circuiting between the patterns arranged at fine intervals may be prevented.

In a case where a plurality of units, each comprising a single semiconductor device 10B, are integrally formed, a dicing step is additionally performed after this separation step.

Although a dicing apparatus is used herein to individually separate the units, it is also possible to perform this step by chocolate-bar-breaking, pressing or cutting.

According to this embodiment, after separating the Cu patterns, an insulating film 26 is formed over the patterns 14, 30, 31 and 15, and the insulating film 26 is then patterned so as to expose the portions indicated by the dotted circles shown in FIG. 3A. Thereafter, it is diced at the sections indicated by arrows into individual semiconductor devices 10B.

Figure 8:
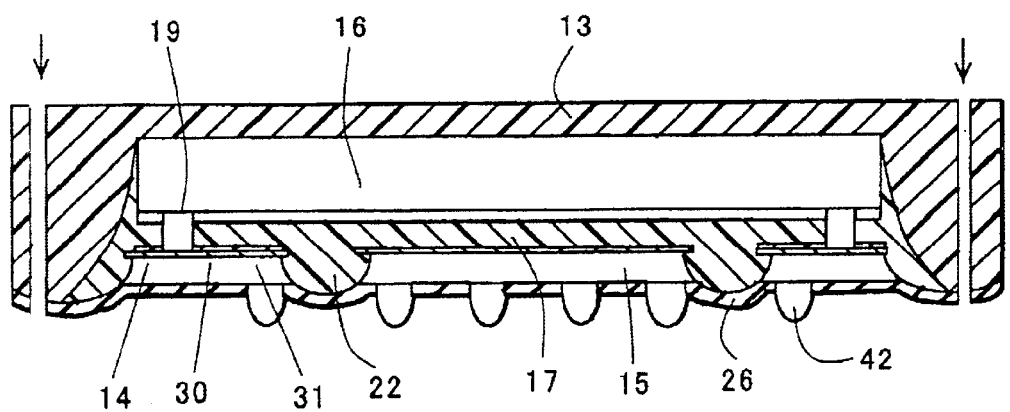
FIG. 8 is a diagram illustrating a manufacturing step of a semiconductor device according to the present invention.

The solder balls 42 may be formed either before or after the dicing step. (FIG. 8)

According to the manufacturing method above, a thin and small package with a superior heat dissipation capability is fabricated, in which the bonding pads, wirings, external connection electrodes, heat radiation electrode and semiconductor chip are embedded within the insulating resin.

Figure 9:
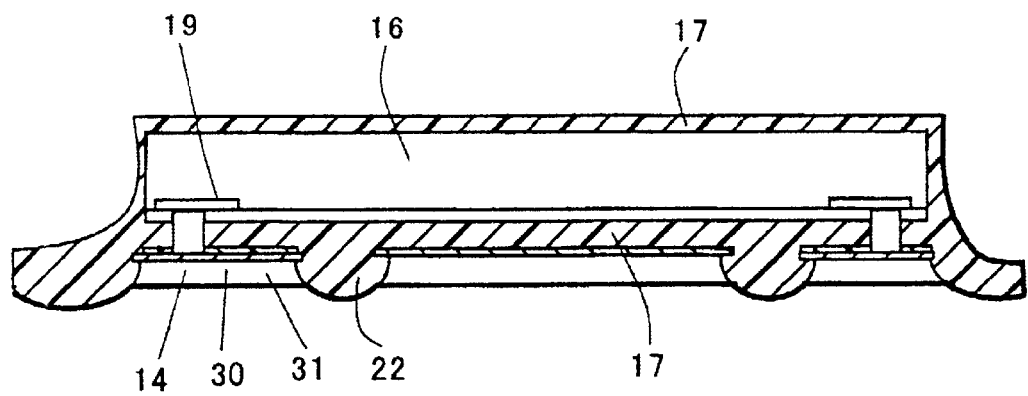
FIG. 9 is a diagram illustrating a semiconductor device of the present invention.
Figure 10:
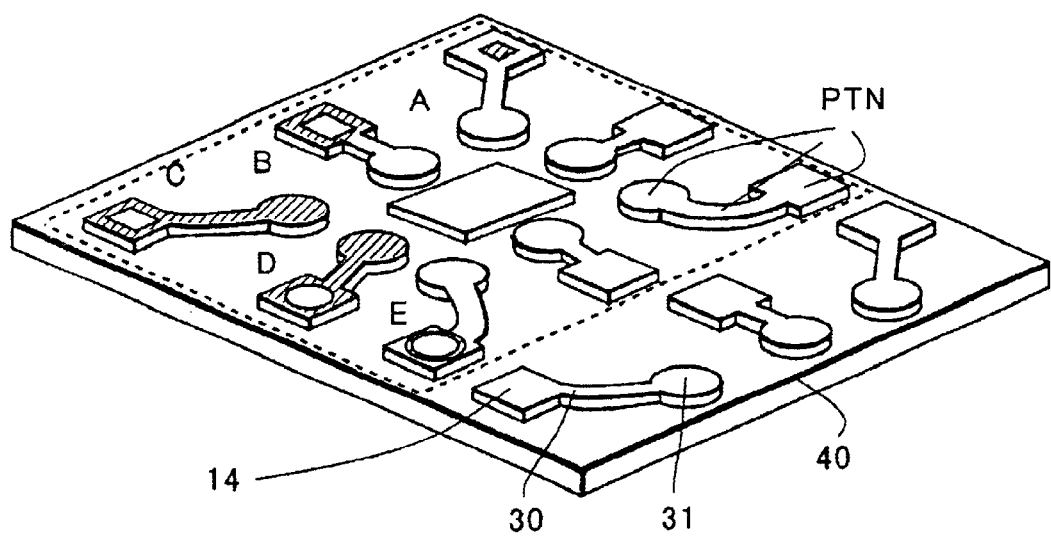
FIG. 10 is a diagram illustrating a film for preventing the running of a material, which is formed on the conductive pattern.

As shown in FIG. 9, the mold may alternatively be achieved by using the insulating adhesive means 17, without using the insulating resin 13. The patterns PTN shown in FIG. 10 represent the pads, wirings, external connection electrodes, and the hatched regions shown thereon represent formation patterns of the film for preventing solder running. This film serves to prevent solder running, and at the same time, it is applied to the other regions to improve the adhesion of the insulating adhesive means. As for alternatives, patterns A through E are illustrated, however, any other pattern may be selected. The solder-running prevention film may also be formed over the entire region other than the regions for solder connections.

The effects obtained by the above manufacturing method will now be explained.

First, since the conductive patterns are half-etched and supported integrally with the conductive foil, a substrate that has conventionally been employed for supporting is unnecessitated.

Second, since the convex conductive patterns are formed by half-etching the conductive foil, it is possible to form finer conductive patterns. Accordingly, their widths and intervals may be minimized, allowing the formation of a package having a smaller two-dimensional size.

Third, since the device may be constituted by conductive patterns, a semiconductor chip, connection means and a molding material, the structure would include only the elements that are truly essential, eliminating the excessive use of materials, thus, a thin and small semiconductor device may be realized with a substantially reduced cost.

Fourth, since the pads, wirings, external connection electrodes and heat radiation electrode are formed as convex portions through half-etching, and the separation to individual elements is performed after the molding step, tie-bars and suspension leads would not be necessary. Accordingly, the necessity for the formation of tie-bars (suspension leads), and cutting step of the tie-bars (suspension leads) are completely eliminated in the present invention.

Fifth, since the conductive foil is eliminated from the back surface of the insulating resin to separate the conductive patterns after the convex conductive patterns are embedded within the insulating resin, flashes of the resin formed between leads as those present in the conventional lead frames can be eliminated.

Sixth, since the semiconductor chip is affixed with the heat radiation electrode via the insulating adhesive means, and the heat radiation electrode is exposed from the back surface, the heat generated by the semiconductor device can be dissipated efficiently from the surface of the semiconductor device to the heat radiation electrode. Furthermore, by mixing fillers such as those made of silicon oxide or aluminum oxide into the insulating adhesive means, the heat-dissipating capability thereof may further be improved. By uniformly designing the filler size, the spacing between the semiconductor chip 16 and the conductive patterns may be evenly retained.

(Embodiment 5)

The fifth embodiment is provided for illustrating a semiconductor device 10A, 10B to which a metal plate 23 is affixed and a semiconductor module using the same. FIG. 1 shows this type of semiconductor module (FCA) 50. The semiconductor device mounted thereto is the semiconductor device 10B shown in FIG. 3.

First, a first supporting member 11 constituted by a flexible sheet will be explained. In the present embodiment, it comprises a first PI sheet 51, a first adhesion layer 52, a conductive pattern 53, a second adhesion layer 54 and a second PI sheet that are sequentially laminated from the bottom. When forming the conductive pattern in multiple layers, additional adhesion layers may be used, and upper and lower layers of the conductive pattern may be electrically connected via through holes. Provided in this first supporting member 11 is a first opening 12 which would allow at least a metal plate 23 to be exposed as shown in FIG. 1C.

A second opening 56 is also formed in order to expose the conductive pattern. The second opening 56 may entirely expose the corresponding conductive pattern 32, or may partially expose only the portion for forming connections. For example, the second PI sheet 55 and the second adhesion layer 54 may entirely be eliminated, or, as shown in the figure, while entirely eliminating the second PI sheet, the second adhesion layer 54 may partially be eliminated only at the locations required to be exposed. According to the later manner, running of the solder 27 may be prevented.

The significance of this semiconductor device of the present invention is in that a metal plate 23 is adhered to the back surface of the heat radiation electrode 15. The significance of the semiconductor module of the present invention is in that the back surface of the metal plate 23 and the back surface of the first supporting member would become substantially within a same plane.

The thickness of the metal plate 23 is determined according to the thicknesses of the first supporting member 11 and the fixation plate 25. The thicknesses are respectively determined in a manner so that the metal plate 23 exposed from the first opening 12 and the back surface of the first supporting member 11 can be substantially within a same plane when the pads 14 and the conductive pattern 32 are affixed together through the solder balls 27. Accordingly, the metal plate 23 may be abutted to the second supporting member or abutted and adhered to the fixation plate 25 provided on the second supporting member.

Several examples of this connection structure are given below.

In the first example of the structure, a light-weight metal plate such as the one made of Al or stainless steel etc., or a ceramic substrate is used as the second supporting member 24, and the metal plate 23 which has been affixed on the back surface of the semiconductor device 10 is abutted thereto. That is, in this structure, the abutment to the second supporting member 24 is provided without the use of the fixation plate 25. The fixation between the heat radiation electrode 15 and the metal plate 23, and between the metal plate 23 and the second supporting member 24 is achieved by a brazing material such as solder etc. or an insulating adhesive means containing fillers having a superior thermal conductivity.

In the second example, the structure employs a light-weight metal plate such as the one made of Al or stainless steel etc. or a ceramic substrate as for the second supporting member 24, and a fixation plate 25 is formed thereon, and this fixation plate 25 and the metal plate 23 is affixed together.

Where an Al plate is used as the second supporting member 24 for example, the fixation plate 25 is preferably the one made of Cu. This is because Cu can be plated over Al. This maybe formed in a thickness of, up to about 10 μm. In addition, since it is a plated film, it may be formed in intimate contact with the second supporting member 24, making the thermal resistance between the fixation plate 25 and the second supporting member 24 extremely small. Alternatively, a conductive past may be applied to form the fixation plate 25.

The Cu fixation plate 25 and the Al substrate may be adhered using an adhesive, however, in this case the thermal resistance would become larger.

Where a ceramic substrate is used as the second supporting member 24, the fixation plate 25 is formed on an electrode formed by print-baking a conductive paste.

The second supporting member 24 and the first supporting member 11 are adhered together via a third adhesion layer 57.

For instance;
First PI sheet 51: 25 μm
Second PI sheet 55: 25 μm
First through third adhesion layers 52, 54, 57: 25 μm after being baked (an acrylic adhesive is used)
Solder balls 27: 50 μm
Conductive pattern 53: 25 μm
Fixation plate 25: approximately 25 μm.
Where the thicknesses of the respective films are adjusted in this way, then after affixing the semiconductor device onto the first supporting member 11, the second supporting member 24 having the fixation plated 25 formed thereon would be readily adhered.

Where a module is provided, in which the second supporting member 24 is attached to the first supporting member 11, and the semiconductor device 10 is placed within an opening 56 provided in this module and then soldered, the soldering may be performed at once without promoting connection failures.

Accordingly, the heat generated by the semiconductor chip 16 may be dissipated into the second supporting member 24 via the heat-dissipating plate 15, metal plate 23 and fixation plate 25. Moreover, since it provides a substantial reduction in the thermal resistance compared to that of the conventional art structure (FIG. 18B), the driving current and the driving frequency of the semiconductor chip 16 can be maximized. The back surface of this second supporting member 24 may be attached to the actuator 107, bottom of the casing 101 or the arm 105 shown in FIG. 17. Therefore, the heat from the semiconductor chip can ultimately be emitted to the outside via the casing 101. Accordingly, even if the semiconductor module is mounted within the hard disk 100, the temperature of the semiconductor chip itself is kept relatively low, so that the read/write speed of the hard disk 100 can be further accelerated. This FCA may be mounted on an apparatus other than a hard disk. In this case, the second supporting member should be abutted to a member of the apparatus having a small thermal resistance. Where it is mounted in any other apparatus, a printed board or a ceramic substrate may also be used instead of the flexible sheet.

(Embodiment 6)

Figure 11:
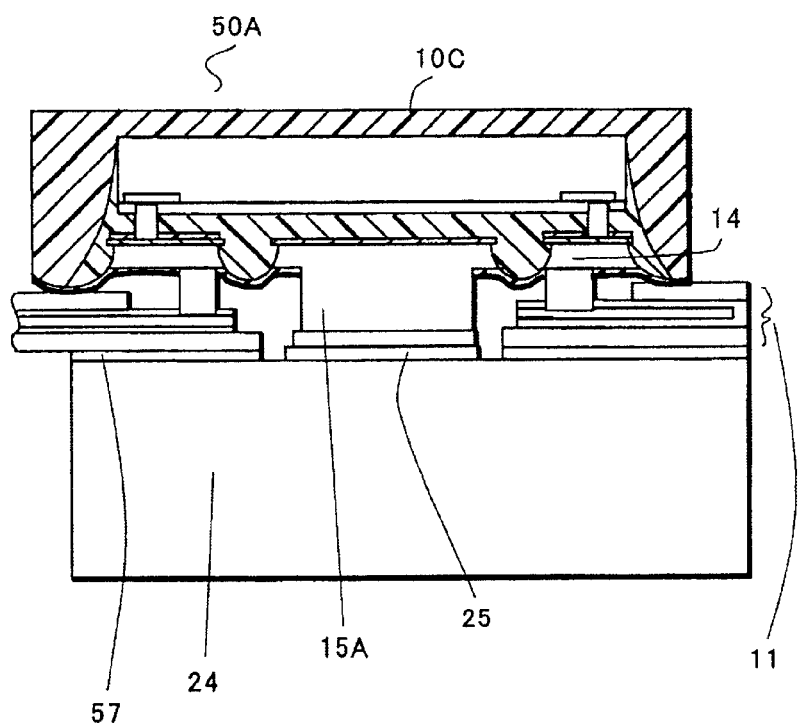
FIG. 11 is a diagram illustrating a semiconductor module of the present invention.

The sixth embodiment is provided to illustrate a semiconductor device 10C in which the heat radiation electrode 15 is made protrusive to substitute the metal plate, and a semiconductor module 50A using the same. FIG. 11 shows a structure in which the heat radiation electrode 15A protrudes beyond the back surfaces of the pads 14 as if the heat radiation electrode 15 and the metal plate 23 are constituted by an integral element.

First, the manufacturing method thereof will be explained with reference to FIGS. 12 through 14. Its manufacturing steps corresponding to the steps illustrated in FIGS. 4 through 8 are identical and the descriptions for these steps would not be repeated.

Figure 12:
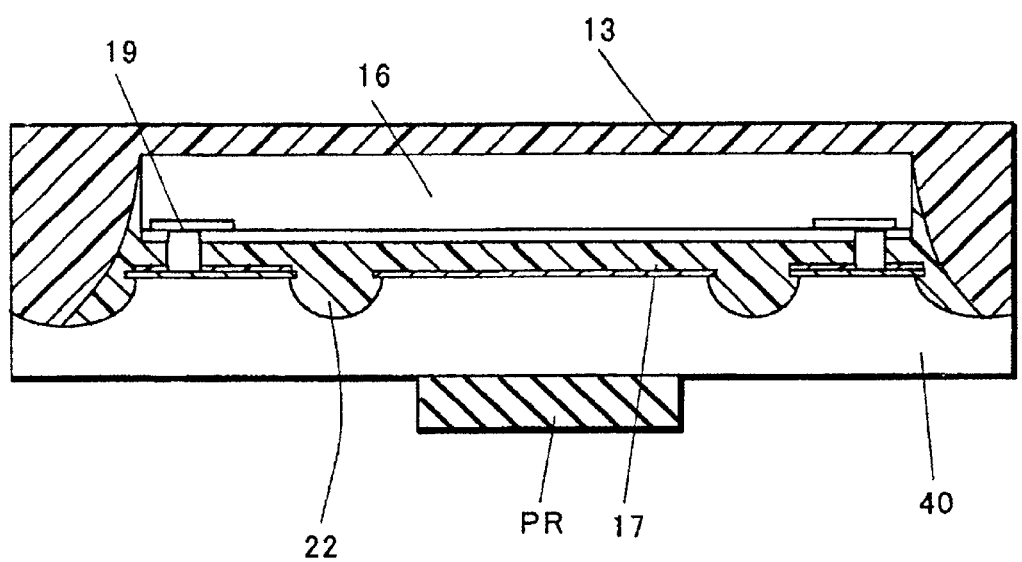
FIG. 12 is a diagram illustrating a manufacturing step of a semiconductor device according to the present invention.
Figure 13:
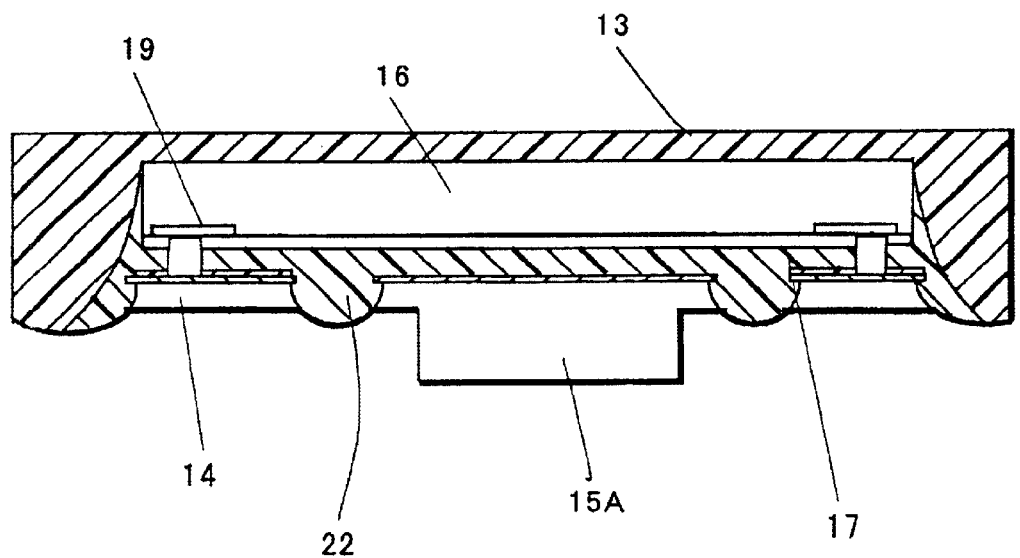
FIG. 13 is a diagram illustrating a manufacturing step of the semiconductor device according to the present invention.

FIG. 12 shows the conductive foil 40 being covered by the insulating resin 13, and on the portion corresponding to the heat radiation electrode 15, a photo resist PR is formed. When this conductive foil 40 is etched via the photo resist PR, the resultant heat radiation electrode 15A would have a structure which protrudes beyond the back surfaces of the pads 14, as shown in FIG. 13. Alternatively, a conductive film made of Ag or Au etc. may be selectively formed and used as a mask instead of the photo resist PR. This film would function also as an anti-oxidizing film.

In the structure such as the one shown in FIG. 1 in which the metal plate 23 is adhered, since the metal plate 23 is extremely thin (i.e. 125 μm), the workability is extremely poor. On the other hand, where the heat radiation electrode 15A is etched to have the protrusive structure, the attaching step of the metal plate 23 may be eliminated.

Figure 14A:
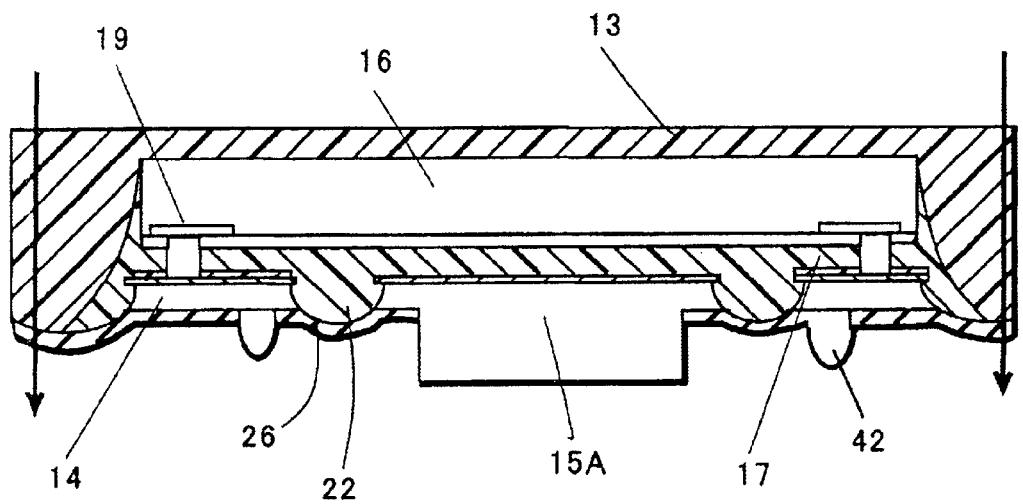
FIGS. 14A–14B are diagrams illustrating a manufacturing step of the semiconductor device according to the present invention.
Figure 14B:
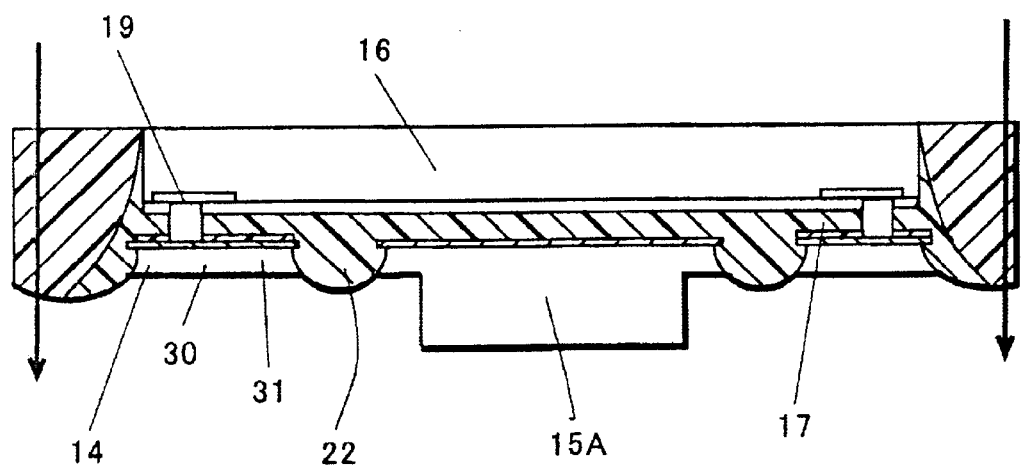

Next, as shown in FIG. 14, after the pads 14, wirings 30 and external connection electrodes 31 are completely separated, the insulating film 26 is formed, and the portions for providing solder balls are exposed. After it is affixed via the solder balls 42, it is diced at the sections indicated by arrows.

The isolated semiconductor device is then mounted on the first supporting member 11 as shown in FIG. 11. Thereafter, the second supporting member 24 is attached thereto as previously mentioned. At this point, since the heat radiation electrode 15A is protrusive, it can be readily connected to the fixation plate 25 via soldering etc.

Shown in FIG. 14B is a structure in which the back surface of the semiconductor chip 16 is exposed from the insulating resin. For example, by performing the molding step while abutting the back surface of the semiconductor chip to the top mold, then the molded structure such as the one shown may be obtained.

(Embodiment 7)

Figure 15A:
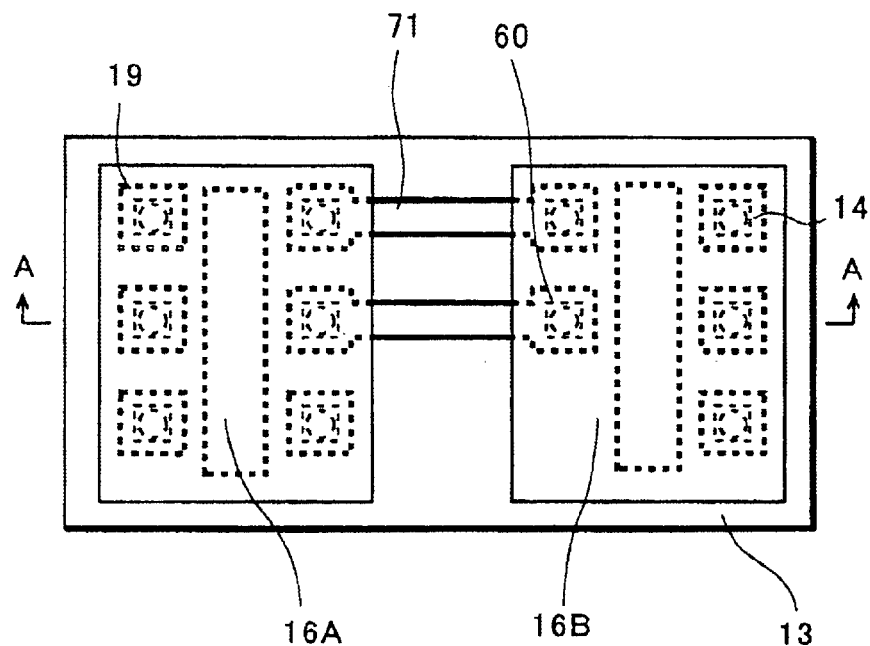
Figure 15B:
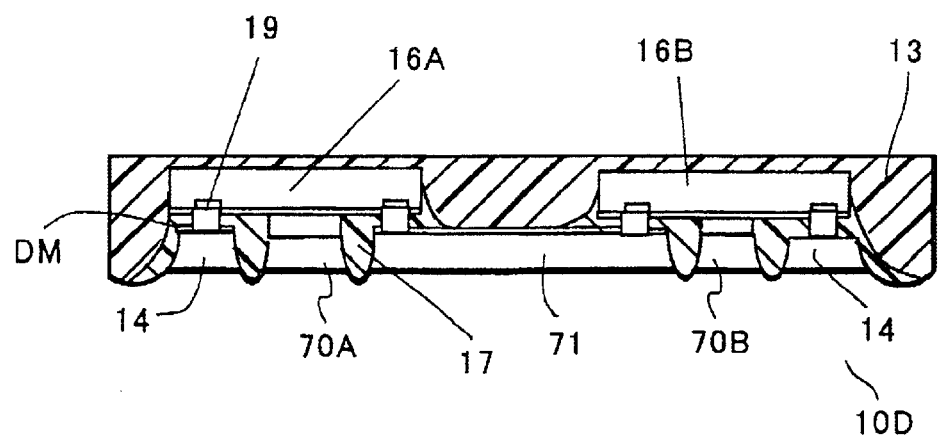

The seventh embodiment is provided to illustrate another semiconductor device. FIG. 15A shows a plan view of the semiconductor device 10D according to the present invention, and FIG. 15B shows a cross-sectional view of FIG. 15A taken along the line A—A.

According to the present invention, a first heat radiation electrode 70A and a second heat radiation electrode 70B are disposed substantially in a same plane, and along the peripheries thereof, pads 14 are arranged. The back surfaces of these pads 14 themselves serve as the external connection electrodes, however, the re-arranged type of wirings shown in FIG. 3 may instead be employed. Between the chips, at least one bridge 71 is disposed. At the both ends of the bridges 71, pads 14 are integrally formed, and these pads 14 too are connected to the bonding electrodes 19.

Over the first heat radiation electrode 70A, a first semiconductor chip 16A is affixed, and over the second heat radiation electrode 70B, a second semiconductor chip 16B is affixed, and they are connected via solder.

As apparent from the above explanation, by half-etching the conductive foil, and performing the molding of the insulating resin 13 before the foil is completely separated, the risk of having the bridges 71 fall down or slip out may be eliminated.

As in the present embodiment, a plurality of chips may be packaged into a single package.

The embodiments described heretofore are provided in order to illustrate the structures designed in consideration with the heat-dissipating capability of a single read/write amplifying IC. However, where the applications to various types of apparatus are contemplated, there may be a case in which the heat-dissipating capability of a plurality of semiconductor chips must be considered. Of course, it is possible to package them into separate, individual packages, however, the plurality of the semiconductor chips may also be packaged into one package as illustrated in FIG. 15.

The metal plates may of course be provided in either the structure in which they are attached to the heat radiation electrodes as shown in FIG. 1 or the structure in which the heat radiation electrodes themselves are designed to have the protrusive structure as shown in FIG. 11. These devices may be mounted on a flexible sheet or a flexible sheet having the second supporting member attached thereon.

FIG. 16 shows a series of diagrams for illustrating several methods that are applicable to any of the embodiments for providing connection between bumps B formed on the semiconductor chip 16 and the pads 14.

FIG. 16A illustrates an ACP/F (anisotropic conductive paste/film) method in which the electrical conduction is achieved by providing conductive particles between the bump B and the pad 14 (or plated film P), and applying pressure.

FIG. 16B illustrates an SBB (stand bump bonding) method in which, as the bump B and the pad 14 (or plated film) are connected, conductive paste CP is simultaneously provided at the periphery.

FIG. 16C illustrates an ESC (epoxy encapsulated solder connection) method in which, as the bump B is pressure-welded, molten solder SD is simultaneously provided at the periphery.

FIG. 16D illustrates an NCP (non-conductive paste) method in which an insulating adhesive means is provided around the bump B which has been pressure-welded to achieve electrical conduction.

FIG. 16E illustrates a GGI (gold-gold interconnection) method in which an Au bump and a plated Au film P are connected by ultrasonic wave.

FIG. 16F illustrates a solder bump method in which the connection is achieved through soldering, and an insulating adhesive means or an under fill is introduced into the gap. The disclosure herein employs this method.

As listed above, there are a variety of connecting methods available, however, in consideration with the connection strength, a method should be selected from the above. A structure such as the one from the above may also be used for the connections between the back surfaces of the external connection electrodes and the first supporting member 11.

The embodiments described above are explained with a flexible sheet as a substrate, however, a ceramic substrate, a printed board, a flexible sheet, a metal substrate or a glass substrate etc. can also be applied to the substrate of the present invention.

As apparent from the above description, the present invention provides an advantage in that the mounting of the device on an FCA can be facilitated by providing the semiconductor device in which the metal plate protrudes beyond the back surfaces of the external connection electrodes or the pads by affixing a metal plate to a heat radiation electrode exposed from the back surface of the package.

Especially, by providing an opening to the FCA so as to allow the back surface of the FCA and the heat radiation electrode of the semiconductor device to be within a same plane, the abutment to the second supporting member can be readily achieved.

By using Al as for the second supporting member material and by forming thereon a fixation plate made of Cu, and affixing the heat radiation electrode or the metal plate to this fixation plate, the heat generated by the semiconductor chip may be externally dissipated via the second supporting member.

Accordingly, the temperature rise of the semiconductor chip maybe prevented, allowing the device to operate at a higher performance level close to its inherent capability. Especially, such an FCA used in a hard disk is capable of providing efficient external emission of heat so that the read/write speed of the hard disk may be increased.

What is claimed is:

1. A semiconductor device comprising:
    a semiconductor chip integrally sealed in a face-down state by an insulating resin with a bonding electrode provided at an underside of the semiconductor chip;
    a pad disposed below the semiconductor chip and electrically connected to the bonding electrode of the semiconductor chip and exposed from the insulating resin at a back surface of the pad, said pad having a curved side to anchor to the insulating resin;
    a heat radiation electrode disposed below the semiconductor chip and exposed from the insulating resin at an underside of the radiation electrode; and
    a metal plate coupled to the exposed underside of the heat radiation electrode to protrude beyond the back surface of the pad,
    wherein the pad and the bonding electrode are superposed, and an electrical signal is picked up from the pad directly connected to the bonding electrode via a brazing material.

2. A semiconductor device as claimed in claim 1, wherein the back surface of the pad and the back surface of the heat radiation electrode are disposed substantially within a same plane.

3. A semiconductor device as claimed in claim 1, wherein the semiconductor chip and the heat radiation electrode are affixed together by an insulating material.

4. A semiconductor device as claimed in claim 3, wherein the heat radiation electrode and the metal plate are affixed together by an insulating material or a conductive material.

5. A semiconductor device as claimed in claim 1, wherein the back surface of the insulating resin protrudes beyond the back surface of the pad.

6. The semiconductor device of claim 1 further comprising an conductive foil wherein the pad is integrally formed with a conductive film, and formed by partially etching the conductive foil.

7. The semiconductor device of claim 1 wherein the pads are entirely underneath the semiconductor device.

8. A semiconductor module comprising:
a first supporting member having a conductive pattern provided thereon;
a semiconductor device including:
a semiconductor chip electrically connected to the conductive pattern integrally and sealed by an insulating resin in a face-down state with a bonding electrode provided at the underside of the semiconductor chip;
a pad electrically connected to the bonding electrode and the conductive pattern and exposed at a back side of the insulating resin, the pad having a curved side;
a heat radiation electrode disposed on the surface of the semiconductor chip and exposed at a back side of the insulating resin;
an opening portion provided in the first supporting member at a location corresponding to the heat radiation electrode; and
a metal plate affixed to the heat radiation electrode in the opening portion,
wherein the pad and the bonding electrode are superposed, and an electrical signal is picked up from the pad directly connected to the bonding electrode via a brazing material.

9. A semiconductor device as claimed in claim 8, further comprising a second supporting member affixed the metal plate and adhered onto the back surface of the first supporting member.

10. A semiconductor module as claimed in claim 9, further comprising a fixation plate made of a conductive material provided on the second supporting member at a location corresponding to the metal plate, wherein the fixation plate and the metal plate are thermally coupled.

11. A semiconductor module as claimed in claim 10, wherein the metal plate is mainly made of Cu, the second supporting member is mainly made of Al, and the fixation plate is constituted by a plated film mainly made of Cu which is formed on the second supporting member.

12. A semiconductor module as claimed in claim 8, wherein the back surface of the insulating resin protrudes beyond the back surface of the pad.

13. A semiconductor module as claimed in claim 8, wherein said pad having a curved side to anchor to the insulating resin.

14. A semiconductor module as claimed in claim 8, wherein said heat radiation electrode having a curved side.

15. The semiconductor module of claim 8 further comprising an conductive foil wherein the pad is integrally formed with a conductive film, and formed by partially etching the conductive foil.

16. The semiconductor module of claim 8 wherein the pads are entirely underneath the semiconductor module.

* * * * *